United States Patent
Wu et al.

(10) Patent No.: US 9,947,676 B2
(45) Date of Patent: Apr. 17, 2018

(54) NVM MEMORY HKMG INTEGRATION TECHNOLOGY

(71) Applicant: Taiwan Semiconductor Manufacturing Co., Ltd., Hsin-Chu (TW)

(72) Inventors: Wei Cheng Wu, Zhubei (TW); Chien-Hung Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/205,221

(22) Filed: Jul. 8, 2016

(65) Prior Publication Data
US 2018/0012898 A1    Jan. 11, 2018

(51) Int. Cl.
| | |
|---|---|
| *H01L 27/115* | (2017.01) |
| *H01L 21/28* | (2006.01) |
| *H01L 21/3213* | (2006.01) |
| *H01L 21/3105* | (2006.01) |
| *H01L 29/66* | (2006.01) |
| *H01L 29/423* | (2006.01) |
| *H01L 29/788* | (2006.01) |
| *H01L 27/11521* | (2017.01) |
| *H01L 27/11526* | (2017.01) |

(52) U.S. Cl.
CPC .. *H01L 27/11521* (2013.01); *H01L 27/11526* (2013.01); *H01L 29/42328* (2013.01); *H01L 29/66825* (2013.01); *H01L 29/7883* (2013.01)

(58) Field of Classification Search
CPC ......... H01L 27/11521; H01L 29/42328; H01L 27/11526; H01L 29/66825; H01L 29/7883; H01L 27/1157; H01L 21/28282; H01L 21/30625; H01L 27/11573; H01L 29/42344
USPC .................................................. 257/314–324
See application file for complete search history.

(56) References Cited

U.S. PATENT DOCUMENTS

| | | | |
|---|---|---|---|
| 9,583,499 B1* | 2/2017 | Zhu | H01L 27/11524 |
| 2017/0025427 A1* | 1/2017 | Su | H01L 27/11524 |
| 2017/0117372 A1* | 4/2017 | Li | H01L 29/42328 |

* cited by examiner

*Primary Examiner* — Marcos D Pizarro
*Assistant Examiner* — Nelson Garces
(74) *Attorney, Agent, or Firm* — Eschweiler & Potashnik, LLC

(57) ABSTRACT

The present disclosure relates to an integrated circuit (IC) that includes a HKMG hybrid non-volatile memory (NVM) device and that provides small scale and high performance, and a method of formation. In some embodiments, the integrated circuit includes a memory region having a NVM device with a pair of control gate electrodes separated from a substrate by corresponding floating gates. A pair of select gate electrodes are disposed at opposite sides of the pair of control gate electrodes. A logic region is disposed adjacent to the memory region and has a logic device with a metal gate electrode disposed over a logic gate dielectric and having bottom and sidewall surfaces covered by a high-k gate dielectric layer. The select gate electrodes or the control gate electrodes comprise metal and have bottom and sidewall surfaces covered by the high-k gate dielectric layer.

20 Claims, 11 Drawing Sheets

1400b

1400c

NVM MEMORY HKMG INTEGRATION TECHNOLOGY

BACKGROUND

Embedded memory is a technology that is used in the semiconductor industry to improve performance of an integrated circuit (IC). Embedded memory is a non-stand-alone memory, which is integrated on the same chip with a logic core and which supports the logic core to accomplish an intended function. High-performance embedded memory enables high-speed and wide bus-width capability, which limits or eliminates inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
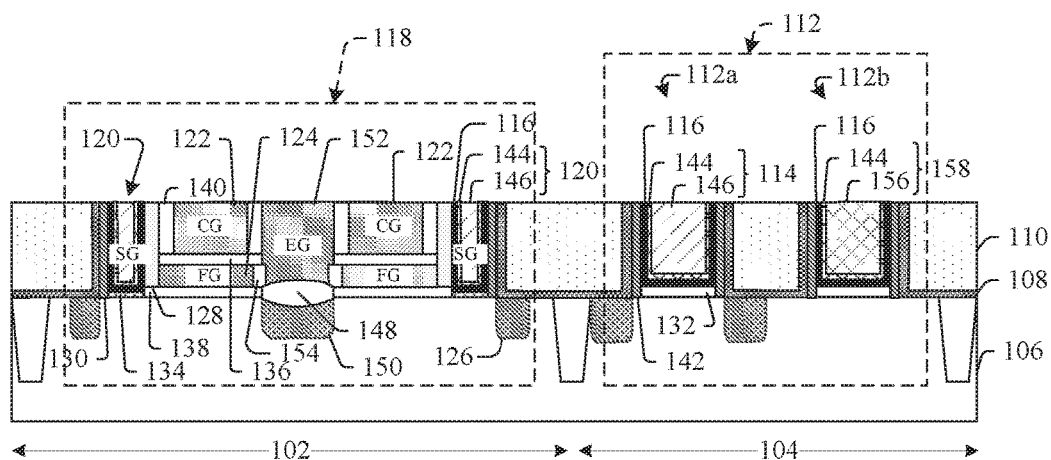
FIG. 1 illustrates a cross-sectional view of some embodiments of an integrated circuit (IC) comprising a hybrid high-k metal gate (HKMG) non-volatile memory (NVM) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the semiconductor industry has begun to integrate logic devices and memory devices on a single semiconductor chip. This integration improves performance over solutions where two separate chips—one for memory and another for logic—cause undesirable delays due to wires or leads that connect the two chips. In addition, the processing costs for integrating memory and logic devices on the same semiconductor chip are reduced due to the sharing of specific process steps used to fabricate both types of devices. One common type of embedded memory is embedded flash memory, which may include an array of flash memory cells. A flash memory cell comprises a floating gate electrically insulated by an insulation dielectric. A control gate of the flash memory cell is separated from a channel region within the substrate by the floating gate.

High-k metal gate (HKMG) technology has also become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power.

The present disclosure relates to an integrated circuit (IC) that comprises a small scale and high performance non-volatile memory (NVM) device including high-k metal gates (HKMG) incorporated within both a memory region and an adjacent logic region of the integrated circuit, and a method of formation. In some embodiments, the logic region of the integrated circuit comprises a logic device disposed over a substrate and includes a metal gate electrode having bottom and sidewall surfaces covered by a high-k gate dielectric layer and disposed over a logic gate dielectric. The memory region of the integrated circuit comprises a non-volatile memory (NVM) device including a pair of control gate electrodes separated from the substrate by corresponding floating gates. A pair of select gate electrodes are disposed at opposite sides of the pair of control gate electrodes and are separated from the substrate by a select gate dielectric. In some embodiments, the select gate electrodes or the control gate electrodes comprise metal, for example, the same metal material that the metal gate electrode of the logic device is made from. By integrating the HKMG process for the logic region and the memory region, manufacturing processes are simplified and device performance is improved, such that further scaling becomes possible in emerging technology nodes.

FIG. 1 illustrates a cross-sectional view of some embodiments of an IC 100 comprising a hybrid HKMG NVM device (e.g., a semiconductor control gate electrode integrated with a HKMG select gate electrode and a HKMG logic gate electrode). The IC 100 comprises a memory region 102 and a logic region 104 disposed adjacent to the memory region 102. The logic region 104 comprises a logic device 112 disposed over a substrate 106, which includes a first transistor 112a and a second transistor 112b. In some embodiments, the first transistor 112a (e.g. a NMOS transistor) comprises a first metal gate electrode 114 and the second transistor 112b (e.g. a PMOS transistor) comprises a second metal gate electrode 158. The first metal gate electrode 114 and the second metal gate electrode 158 respectively have their bottom and sidewall surfaces covered a high-k gate dielectric layer 116 and are disposed over a logic gate dielectric 132. The memory region 102 comprises a non-volatile memory (NVM) device 118 including a pair of control gate electrodes 122 separated from the substrate 106 by corresponding floating gates 124. In some embodiments, a pair of select gate electrodes 120 are disposed at opposite sides of the pair of control gate electrodes 122 and separated from the substrate 106 by a select gate dielectric 134. In some embodiments, the select gate electrodes 120 comprise metal and have their bottom and sidewall surfaces covered the high-k gate dielectric layer 116. By making use of a HKMG structure in logic transistors and select gate electrodes, gate leakage and power consumption are reduced and device speed is improved.

In some embodiments, the select gate electrodes 120 comprise the same metal material as the first metal gate electrode 114 or the second metal gate electrode 158. In some embodiments, the first metal gate electrode 114 may comprise a core metal layer 146 separated from the high-k gate dielectric layer 116 by a barrier layer 144. In some embodiments, the core metal layer 146 may comprise copper (Cu), tungsten (W) or aluminum (Al), for example. The barrier layer 144 protects the core metal layer 146 from diffusion and can comprise metal materials such as titanium (Ti), tantalum (Ta), zirconium (Zr), or their alloys, for example. In some embodiments, the high-k gate dielectric layer 116 may comprise hafnium oxide (HfO), hafnium silicon oxide (HfSiO), hafnium aluminum oxide (HfAlO), or hafnium tantalum oxide (HMO), for example. The second transistor 112b (e.g. a PMOS transistor) may comprise the second metal gate electrode 158 that is made of different compositions and thicknesses from the first metal gate electrode 114, such that working functions of metal gates can be altered. The second metal gate electrode 158 may comprise a second core metal layer 156, which includes different compositions and thicknesses from the first core metal layer 146 and is protected by the same barrier layer 144.

In some embodiments, the NVM device 118 within the memory region 102 may also comprise electrodes made of semiconductor material. For example, the control gate electrodes 122 may comprise doped polysilicon. An erase gate electrode 152 can be disposed between inner sides of the pair of the floating gates 124 on a common source/drain dielectric 148 and can be separated from the floating gates 124 by a tunneling dielectric layer 154. The erase gate electrode 152 may comprise doped polysilicon. The floating gates 124 are disposed on a floating gate dielectric 138 and have upper surfaces covered by an inter-poly dielectric 136. In some embodiments, a control gate spacer 140 can be disposed on the inter-poly dielectric 136 and along sidewalls of the pair of control gate electrodes 122. A floating gate spacer 128 can be disposed on the floating gate dielectric 138 and along outer sidewalls of the pair of the floating gates 124. In some embodiments, the floating gate spacer 128 may comprise one or more layers of oxide or nitride. For example, the floating gate spacer 128 may include a multi-layer structure such as an ONO structure having a nitride layer sandwiched between two oxide layers, or a NON structure having an oxide layer sandwiched between two nitride layers. The floating gate dielectric 138 and the inter-poly dielectric 136 have thicknesses greater than a thickness of the select gate dielectric 134. In some embodiments, the control gate electrodes 122 and the select gate electrodes 120 have cuboid shapes, which have planar upper surfaces coplanar with an upper surface of the metal gate electrode 114. The erase gate electrode 152 may have a planar upper surface coplanar with an upper surface of the control gate electrode 122 and the metal gate electrode 114.

Source/drain regions 126 are arranged alongside the select gate electrodes 120. A common source/drain region 150 can be disposed under the common source/drain dielectric 148. In some embodiments, the select gate electrode 120 may be connected to a word line, which is configured to control access of the NVM device 118. During operation, charges (e.g. electrons) can be trapped in the floating gate 124, setting a NVM memory cell to one logic state (e.g. logical "0"), and can be removed from the floating gate 124 by the erase gate electrode 152 to change the NVM memory cell to another logic state (e.g. logical "1").

In some embodiments, a select gate spacer 130 is disposed on an upper surface of the substrate 106 and along outer sidewalls of the pair of the select gate electrodes 120. A sidewall spacer 142 is disposed along sidewalls of the first and second metal gate electrodes 114, 158 and the logic gate dielectric 132. In some embodiments, the select gate spacer 130 and the sidewall spacer 142 can be made of silicon nitride or silicon oxide. The select gate spacer 130 and the sidewall spacer 142 may have upper surfaces that are aligned with upper surfaces of the first and second metal gate electrodes 114, 158, the select gate electrodes 120, and the control gate electrodes 122. The logic region 104 and the memory region 102 may be laterally separated from one another by an inter-layer dielectric layer 110 arranged over the substrate 106. In some embodiments, the inter-layer dielectric layer 110 may comprise a low-k dielectric layer, an ultra low-k dielectric layer, an extreme low-k dielectric layer, and/or a silicon dioxide layer. Though not shown in FIG. 1, in some embodiments, one or more of the plurality of contacts may extend through the inter-layer dielectric layer 110 and be coupled to the source/drain regions 126. In some embodiments, the plurality of contacts may comprise a metal such as tungsten, copper, and/or aluminum.

In some embodiments, a contact etch stop layer 108 separates the inter-layer dielectric layer 110 from the logic device 112, the NVM device 118 and the substrate 106. The contact etch stop layer 108 may have a 'U' shaped structure and line the logic device 112, the NVM device 118 and an upper surface of the substrate 106. The contact etch stop layer 108 may comprise a planar lateral component connecting a first vertical component abutting the select gate spacer 130 arranged along a side of the NVM device 118 and a second vertical component abutting the sidewall spacer 142 arranged along a side of the logic device 112. Using the inter-layer dielectric layer 110 and the contact etch stop layer 108 to isolate the logic device 112 and the NVM device 118 allows for high device density to be achieved.

Figure 2:
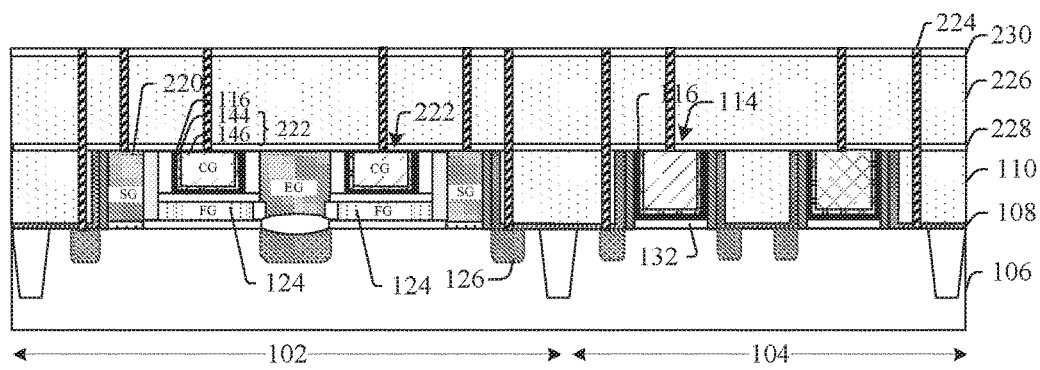
FIG. 2 illustrates a cross-sectional view of some additional embodiments of an IC comprising a hybrid HKMG NVM device.

FIG. 2 illustrates a cross-sectional view of some alternative embodiments of an IC 200 comprising a hybrid HKMG NVM device disposed over a substrate 106 (e.g., a semiconductor select gate electrode integrated with a HKMG control gate electrode and a HKMG logic gate electrode). The IC 200 comprises a memory region 102 and an adjacent logic region 104 disposed adjacent to the memory region 102. The logic region 104 comprises a first metal gate electrode 114 having bottom and sidewall surfaces lined by a high-k gate dielectric layer 116. The first metal gate electrode 114 is disposed over a logic gate dielectric 132. The memory region 102 comprises a pair of control gate electrodes 222, corresponding floating gates 124 disposed underneath, and a pair of select gate electrodes 220 disposed at opposite sides of the pair of control gate electrodes 222. The control gate electrodes 222 comprise metal and have bottom and sidewall surfaces covered by the high-k gate dielectric layer 116. In some embodiments, the control gate electrodes 222 comprise the same metal material as the first metal gate electrode 114. In some embodiments, the control gate electrodes 222 may comprise a core metal layer 146 separated from the high-k gate dielectric layer 116 by a barrier layer 144, which protects the core metal layer 146 from contamination. In some embodiments, the select gate electrodes 220 and the floating gates 124 may comprise doped polysilicon. In some embodiments, a conformal contact etch stop layer 108 and an inter-layer dielectric layer 110 are disposed between the memory region 102 and the logic region 104 for isolation. Additional contact etch stop layers (e.g. 228, 230) and inner-layer dielectric layers (e.g. 226) can be disposed over the inter-layer dielectric layer 110. Contacts 224 can be disposed through the inter-layer dielectric layers to reach source/drain regions 126, the control gate electrodes 222, the select gate electrodes 220, and the first metal gate electrode 114. In some embodiments, the contacts may comprise tungsten (W), for example. By making use of HKMG structure in logic transistors and control gate electrodes, gate leakage and power consumption are reduced and device reliability is improved.

Figure 3:
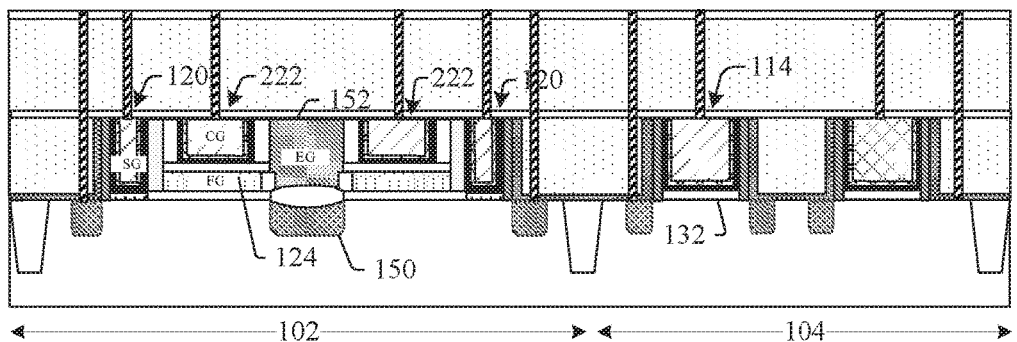
FIG. 3 illustrates a cross-sectional view of some additional embodiments of an IC comprising a HKMG NVM device.

FIG. 3 illustrates a cross-sectional view of some alternative embodiments of an IC 300 comprising a HKMG NVM device disposed over a substrate 106. As some alternative embodiments of the NVM devices shown in FIG. 1 and FIG. 2, the IC 300 comprises a memory region 102 having control gate electrodes 222 and select gate electrodes 120 both comprise metal and having bottom and sidewall surfaces lined by a high-k gate dielectric layer 116. A logic region 104 adjacent to the memory region 102 comprises a transistor with a first metal gate electrode 114 lined by the high-k gate dielectric layer 116 and disposed over a logic gate dielectric 132. An erase gate electrode 152 can be disposed between the control gate electrodes and over a common source/drain region 150. Floating gates 124 are surrounded by insulation dielectrics and coupled to the control gate electrodes 222. The erase gate electrode 152 and the floating gates 124 may comprise doped polysilicon.

FIGS. 4-13 and 14A-14C through 16A-16C illustrate a series of cross-sectional views of some embodiments of a method for manufacturing an IC comprising a hybrid or HKMG NVM device.

Figure 4:
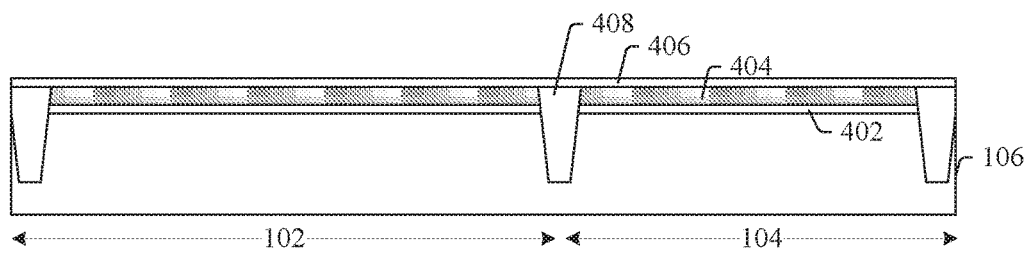
FIGS. 4-13, 14A-14C, 15A-15C, and 16A-16C illustrate a series of cross-sectional views of some embodiments of a method for manufacturing an IC comprising a hybrid or HKMG NVM device.

As shown in cross-sectional view 400 of FIG. 4, a floating gate dielectric layer 402 and a floating gate layer 404 are formed over a substrate 106 within a memory region 102 and a logic region 104. In some embodiments, the memory region 102 and the logic region 104 are separated by an isolation structure 408. In some embodiments, the isolation structure 408 can be formed by forming a deep trench disposed within the substrate 106 and filled with a dielectric material. The isolation structure 408 may have an upper surface that is coplanar with an upper surface of the floating gate layer 404, as a result of a planarization process. In some embodiments, the floating gate dielectric layer 402 comprises silicon dioxide and the floating gate layer 404 comprises doped polysilicon. An inter-poly dielectric layer 406 is then formed over the floating gate layer 404 and the isolation structure 408. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. In some embodiments, the floating gate dielectric layer 402, the floating gate layer 404 and the inter-poly dielectric layer 406 are formed by using a deposition technique (e.g., PVD, CVD, PE-CVD, ALD, etc.).

Figure 5:
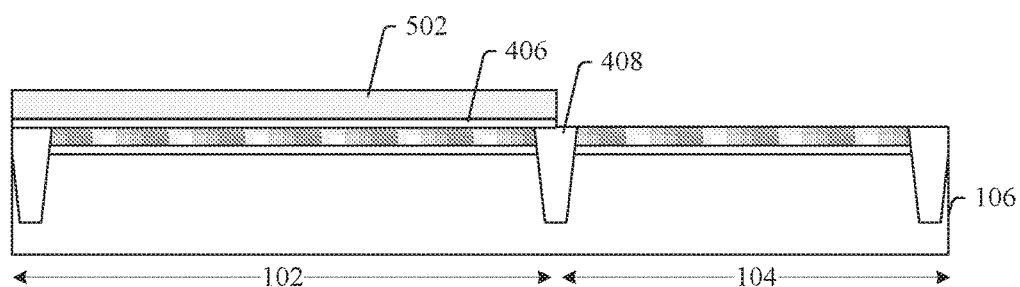

As shown in cross-sectional view 500 of FIG. 5, the inter-poly dielectric layer 406 is patterned so that it remains within the memory region 102 and so that it is removed from the logic region 104. In some embodiments, the inter-poly dielectric layer 406 is removed by performing a photolithography process that patterns a photosensitive masking layer (e.g., a photoresist mask 502) to protect the inter-poly dielectric layer 406 at the memory region 102 from removal by one or more subsequent etching processes. In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.).

Figure 6:
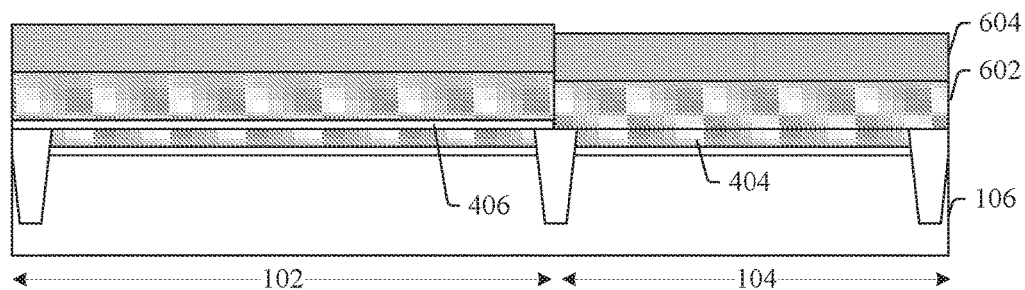

As shown in cross-sectional view 600 of FIG. 6, a control gate layer 602 and a hard mask layer 604 are subsequently formed. Though not shown in FIG. 6, in some alternative embodiments, a planarization process can be performed on the control gate layer 602 or the hard mask layer 604, such that the control gate layer 602 and/or the hard mask layer 604 have planar upper surfaces within the memory region 102 and the logic region 104. The control gate layer 602 and the hard mask layer 604 can be formed directly on the inter-poly dielectric layer 406 within the memory region 102 and directly on the floating gate layer 404 within the logic region 104. In some embodiments, the control gate layer 602 may comprise polysilicon or metal formed by a deposition process (e.g., CVD, PVD, ALD, etc.).

Figure 7:
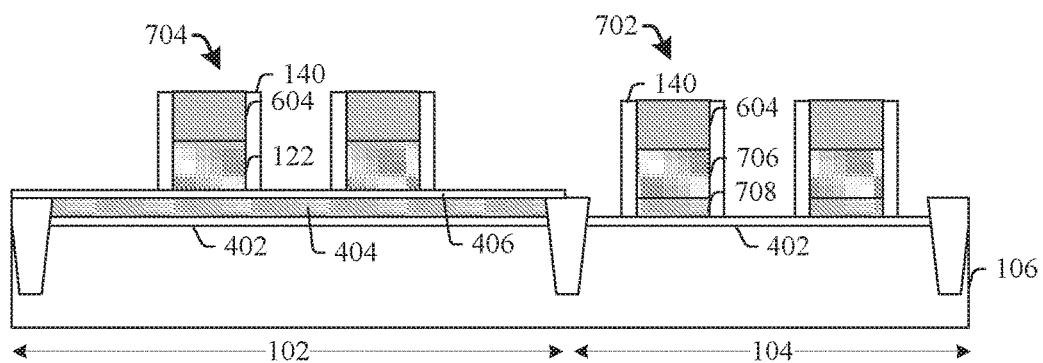

As shown in cross-sectional view 700 of FIG. 7, the hard mask layer 604 and the underlying control gate layer and the floating gate layer within the logic region 104 (shown in FIG. 6) are patterned to form a sacrificial logic gate stack 702 within the logic region 104, and the hard mask layer 604 and the underlying control gate layer within the memory region 102 are patterned to form a sacrificial control gate stack 704. The sacrificial logic gate stack 702 may comprise a first sacrificial gate material 706, which is a portion of the control gate layer 602 of FIG. 6, and a second sacrificial gate material 708, which is a portion of the floating gate layer 404 of FIG. 6. The sacrificial control gate stack 704 may comprise a control gate electrode 122, which is a portion of the control gate layer 602 of FIG. 6, formed under the hard mask layer 604 and over the inter-poly dielectric layer 406. In some embodiments, the sacrificial logic gate stack 702 and the sacrificial control gate stack 704 are formed by performing a photolithography process to pattern the hard mask layer 604 followed by patterning the control gate layer and the floating gate layer according to the hard mask layer 604 using one or more etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.). The etching processes may stop on the inter-poly dielectric layer 406 within the memory region 102, and may stop on the floating gate dielectric layer 402 within the logic region 104. In some embodiments, a control gate spacer 140 is subsequently formed along sidewalls of the sacrificial logic gate stack 702 and the sacrificial control gate stack 704. In some embodiments, the control gate spacer 140 is formed by depositing a conformal dielectric layer followed by etching processes, to remove a lateral portion of the dielectric layer and to leave a vertical portion along the sidewalls of the sacrificial logic gate stack 702 and the sacrificial control gate stack 704.

Figure 8:
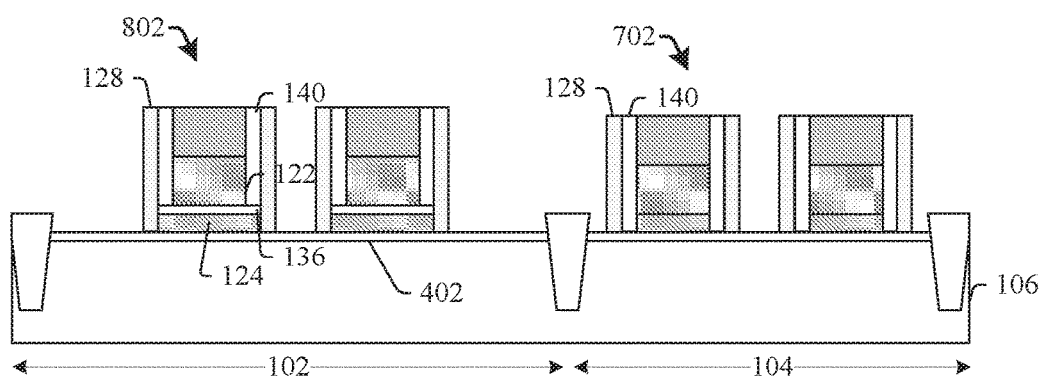

As shown in cross-sectional view 800 of FIG. 8, the inter-poly dielectric layer 406 and the floating gate layer 404 within the memory region 102 are patterned to form a memory gate stack 802 together with the sacrificial control gate stack 704 (shown in FIG. 7). In some embodiments, the inter-poly dielectric layer 406 and the floating gate layer 404 are patterned self-aligned, i.e., according to the sacrificial control gate stack 704 and the control gate spacer 140 as a "mask layer". In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.). The etching processes may stop on the floating gate dielectric layer 402. In some embodiments, a floating gate spacer 128 is subsequently formed along sidewalls of the sacrificial logic gate stack 702 and the memory gate stack 802. In some embodiments, the floating gate spacer 128 may comprise one or more layers of oxide or nitride.

Figure 9:
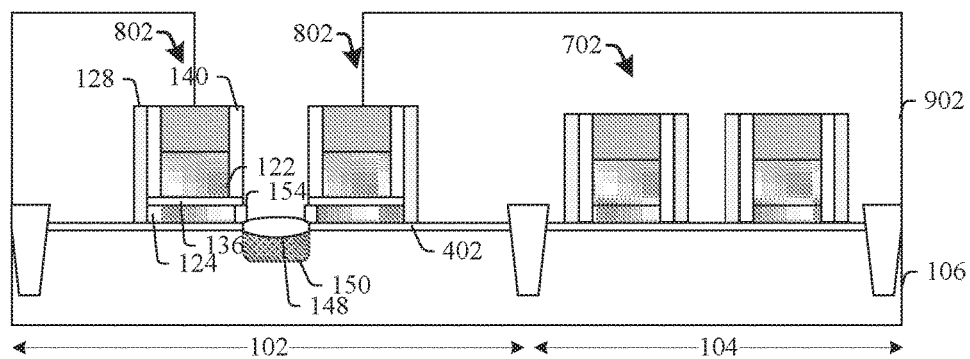

As shown in cross-sectional view 900 of FIG. 9, a common source/drain region 150 is formed between opposing sides of the memory gate stacks 802 within the substrate 106. A portion of the floating gate spacer 128 between the opposing sides of the memory gate stacks 802 is removed with a mask 902 (e.g., a photoresist mask) in place, and a common source/drain dielectric 148 can be formed on the common source/drain region 150, for example by forcing an oxidizing agent to diffuse into the common source/drain region 150. A tunneling dielectric layer 154 is formed along the opposing sides of the floating gates 124. In some embodiments, the tunneling dielectric layer 154 can be formed by thermal oxidation.

Figure 10:
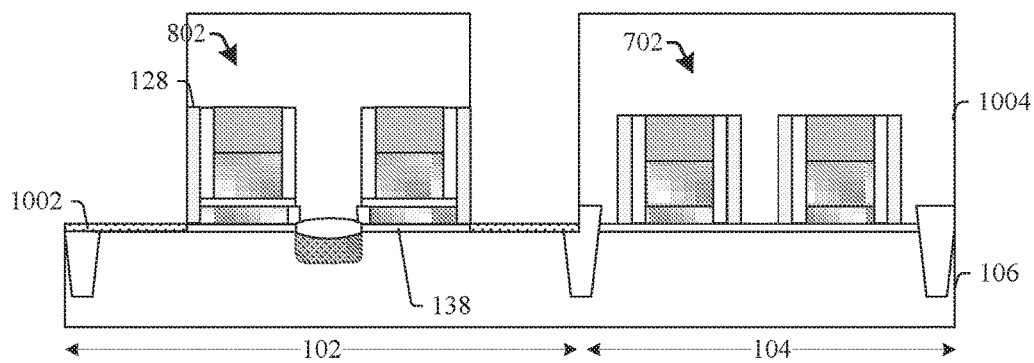

As shown in cross-sectional view 1000 of FIG. 10, the floating gate dielectric layer 402 (shown in FIG. 9) is patterned to form a floating gate dielectric 138 with a mask 1004 (e.g., a photoresist mask) in place. A select gate dielectric layer 1002 is formed on the substrate 106 aside of the floating gate dielectric 138. In some embodiments, the select gate dielectric layer 1002 is formed by a deposition process (e.g., CVD, PVD, ALD, etc.) and has a thickness smaller than that of the floating gate dielectric 138.

Figure 11:
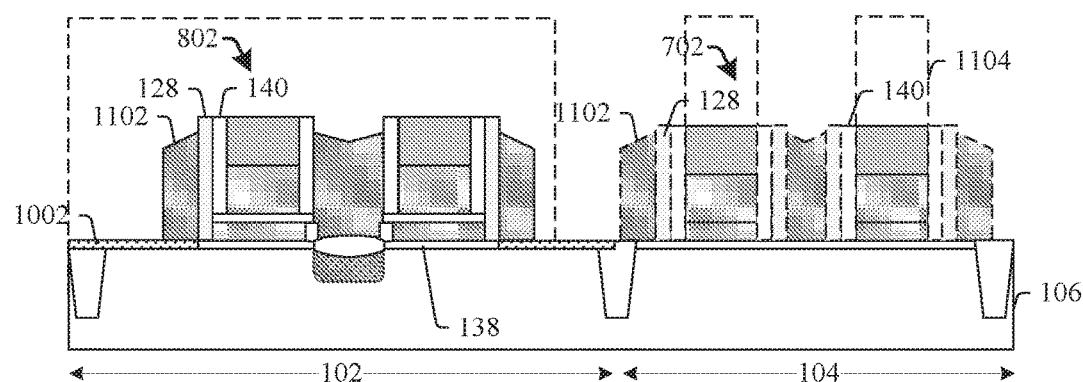

As shown in cross-sectional view 1100 of FIG. 11, a conductive layer 1102 (e.g. a polysilicon layer) is formed along sides of the memory gate stacks 802 and the sacrificial logic gate stacks 702. In some embodiments, the conductive layer 1102 is formed by depositing the conductive layer conformally over the workpiece before performing an etch process, which removes a lateral portion of the conductive layer and leaves a vertical portion along the sidewalls of memory gate stacks 802 and the sacrificial logic gate stack 702. Then the conductive layer 1102 within the logic region 104 is selectively removed with a mask 1104 (e.g., a photoresist mask) in place. Portions of the control gate spacer 140 and the floating gate spacer 128 within the logic region 104 may also be removed.

Figure 12:
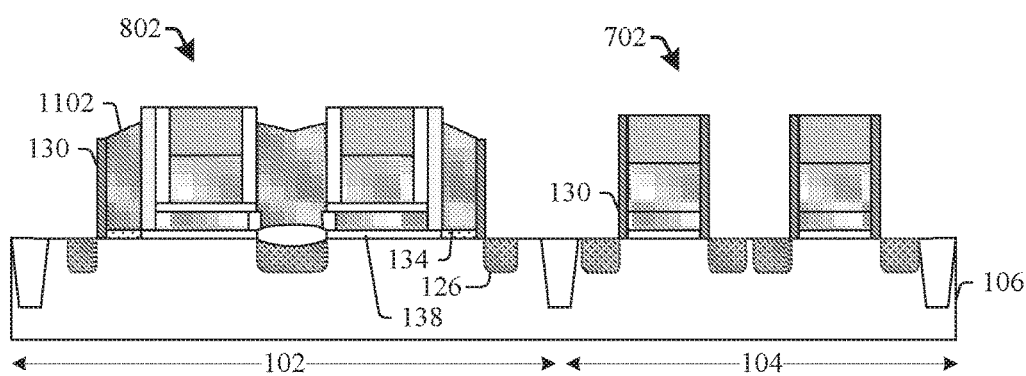

As shown in cross-sectional view 1200 of FIG. 12, a select gate spacer 130 is formed along the conductive layer 1102 within the memory region 102 and along the sacrificial logic gate stacks 702 within the logic region 104. In some embodiments, the select gate spacer 130 is formed by depositing a conformal dielectric layer followed by an etch process, to remove a lateral portion of the dielectric layer and to leave a vertical portion along sidewalls of the conductive layer 1102 and the sacrificial logic gate stacks 702. In some embodiments, the select gate spacer 130 may comprise an oxide (e.g., $SiO_2$) or a nitride (e.g., SiN) formed by a deposition process. The select gate spacer 130 may be formed directly on an upper surface of the substrate 106.

Source/drain regions 126 can subsequently formed within the memory region 102 and within the logic region 104, respectively. In some embodiments, the source/drain regions 126 may be formed by an implantation process that selectively implants the substrate 106 with a dopant, such as boron (B) or phosphorous (P), for example. In some other embodiments, the source/drain regions 126 may be formed by performing an etch process to form a trench followed by an epitaxial growth process. In such embodiments, the source/drain regions 126 may have a raised portion that is higher than the upper surface of the substrate 106. In some embodiments, a salicidation process is performed to form a silicide layer (not shown in the figure) on upper surfaces of the source/drain regions 126. In some embodiments, the salicidation process may be performed by depositing a nickel layer and then performing a thermal annealing process (e.g., a rapid thermal anneal).

Figure 13:
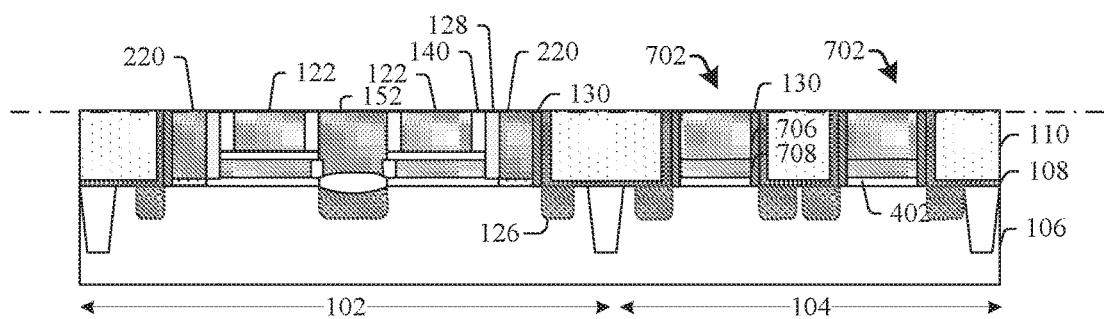

As shown in cross-sectional view 1300 of FIG. 13, a conformal contact etch stop layer 108 is formed over the source/drain regions 126 and extends along the select gate spacer 130. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. In some embodiments, the first planarization process may comprise a chemical mechanical polishing (CMP) process. In some embodiments, the first inter-layer dielectric layer 110 may comprise a low-k dielectric layer, formed by way of a deposition process (e.g., CVD, PVD, etc.). The first sacrificial gate material 706 within the logic region 104 may be exposed after the first planarization process. An erase gate electrode 152 can be formed between opposing sides of control gate electrodes 122, and select gate electrodes 220 can be formed at opposite sides of the control gate electrodes 122. The erase gate electrode 152 and the select gate electrodes 220 can be made from the conductive layer 1102 shown in FIG. 12. FIGS. 14A-14C, 15A-15C and 16A-16C show some alternative embodiments of a subsequent replacement gate process following FIG. 13.

Figure 14A:
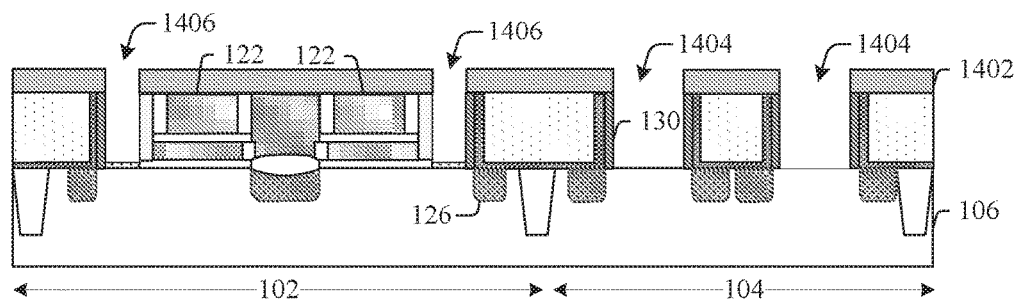
Figure 14B:
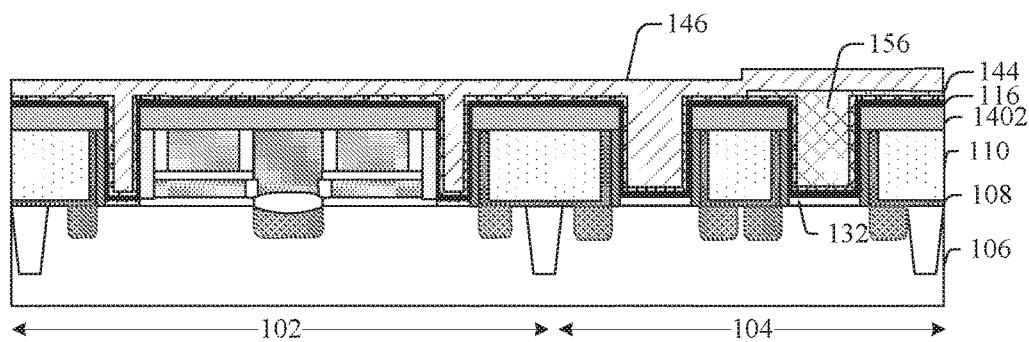
Figure 14C:
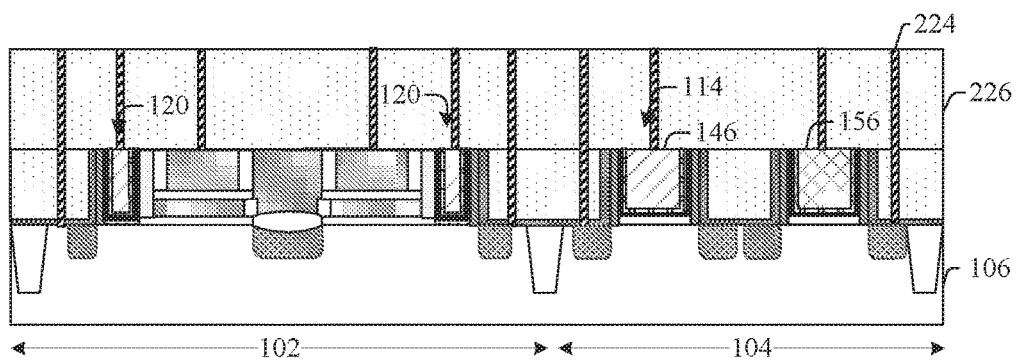

FIGS. 14A-14C show some embodiments of the replacement gate process where the sacrificial logic gate stacks and the select gate electrodes 220 are removed and replaced by metal materials and a high-k dielectric layer. As shown in cross-sectional view 1400a of FIG. 14A, a hard mask 1402 is formed and patterned to expose the sacrificial logic gate stacks within the logic region 104 and the select gate electrodes within the memory region 102 (shown in FIG. 13), and to cover the remaining regions of the memory region 102 and the logic region 104. The first sacrificial gate material 706, the second sacrificial gate material 708 and the select gate electrodes 220 (shown in FIG. 13) are removed, resulting in the formation of trenches 1404, 1406. The control gate electrodes 122 may be protected by the hard mask 1402 and stay in place.

As shown in cross-sectional view 1400b of FIG. 14B, a high-k gate dielectric layer 116 and metal gate materials (e.g. 156, 146) are formed over the first inter-layer dielectric layer 110 and/or the hard mask 1402 and filled into the trenches 1404, 1406 of FIG. 14A through one or more deposition processes (e.g., chemical vapor deposition, physical vapor deposition, etc.). A series of deposition and etching processes can be performed that form different metal compositions within the trenches for different devices or different components of the same devices, to achieve desired work functions. In some embodiments, a barrier layer 144 is lined between the high-k gate dielectric layer 116 and the metal gate materials, to protect the metal gate materials (e.g. 156, 146) from diffusion and can comprises metals such as titanium (Ti), tantalum (Ta), zirconium (Zr), or their alloys, for example. In some embodiments, the floating gate dielectric layer 402 within the trenches 1404 of the logic region 104 can be removed and replaced by a logic gate dielectric 132. The logic gate dielectric 132 may have a thickness smaller than that of the floating gate dielectric layer 402.

As shown in cross-sectional view 1400c of FIG. 14C, a second planarization process may be performed following the deposition processes to form a first metal gate electrode 114, a second metal gate electrode 158, and metal select gate electrodes 120 on the high-k gate dielectric layer 116. Contacts 224 are formed within a second inter-layer dielectric layer 226 overlying the first inter-layer dielectric layer 110. The contacts 224 may be formed by selectively etching the second inter-layer dielectric layer 226 to form openings (e.g. with a patterned photoresist mask in place), and by subsequently depositing a conductive material within the openings. In some embodiments, the conductive material may comprise tungsten (W), for example.

Figure 15A:
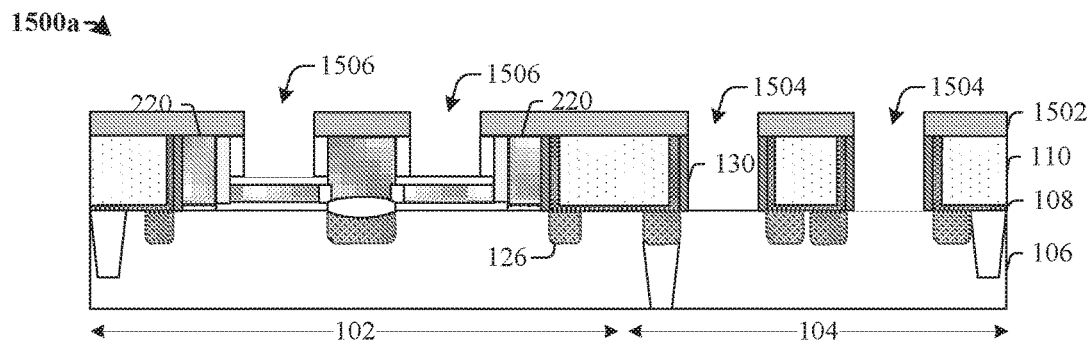
Figure 15B:
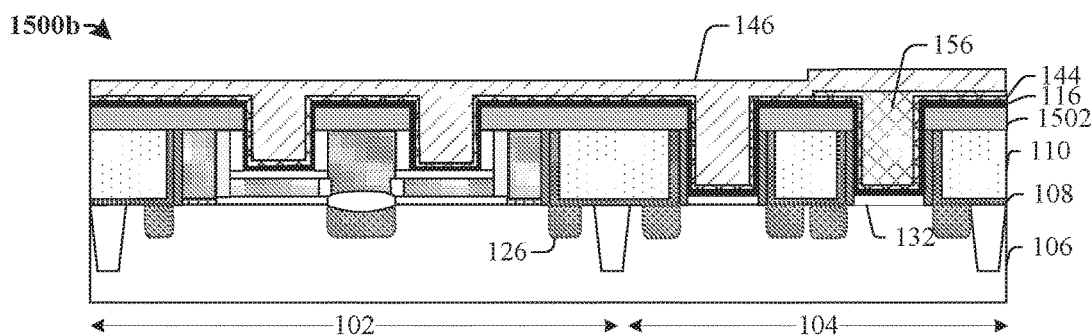
Figure 15C:
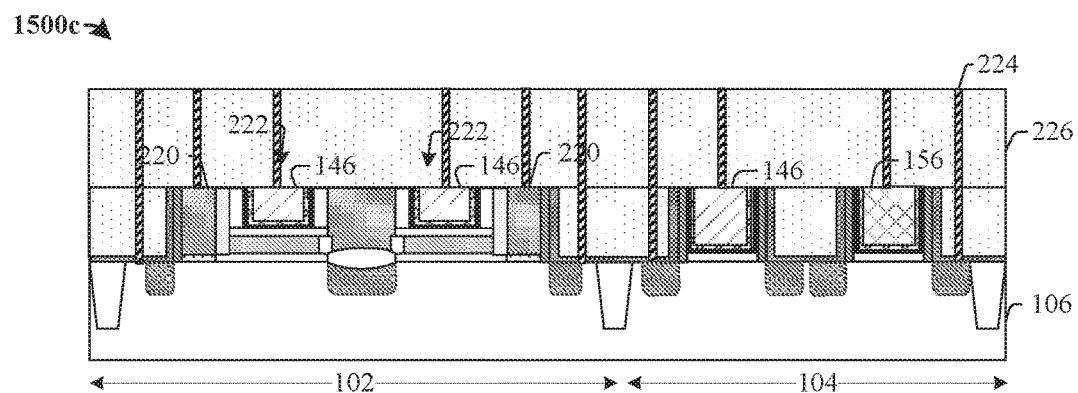

FIGS. 15A-15C show some alternative embodiments of the replacement gate process where the sacrificial logic gate stacks and the control gate electrodes 122 are removed and replaced by metal materials and a high-k dielectric layer. As shown in cross-sectional view 1500a of FIG. 15A, the sacrificial logic gate stack (i.e. the first sacrificial gate material 706 and the second sacrificial gate material 708) and the control gate electrodes 122 (shown in FIG. 13) are removed, resulting in the formation of trenches 1504, 1506. The select gate electrodes 220 may be protected by a hard mask 1502 and stay in place.

As shown in cross-sectional view 1500b of FIG. 15B, a high-k gate dielectric layer 116 and metal gate materials (e.g. 156, 146) are formed over the first inter-layer dielectric layer 110 and/or the hard mask 1502 and filled into the trenches 1504, 1506 of FIG. 15A through one or more deposition processes (e.g., chemical vapor deposition, physical vapor deposition, etc.). In some embodiments, a barrier layer 144 is lined between the high-k gate dielectric layer 116 and the metal gate materials, to protect the metal gate materials (e.g. 156, 146) from diffusion.

As shown in cross-sectional view 1500c of FIG. 15C, a second planarization process may be performed following the deposition processes to form a first metal gate electrode 114, a second metal gate electrode 158, and metal control gate electrodes 222 on the high-k gate dielectric layer 116. Contacts 224 are formed within a second inter-layer dielectric layer 226 overlying the first inter-layer dielectric layer 110.

Figure 16A:
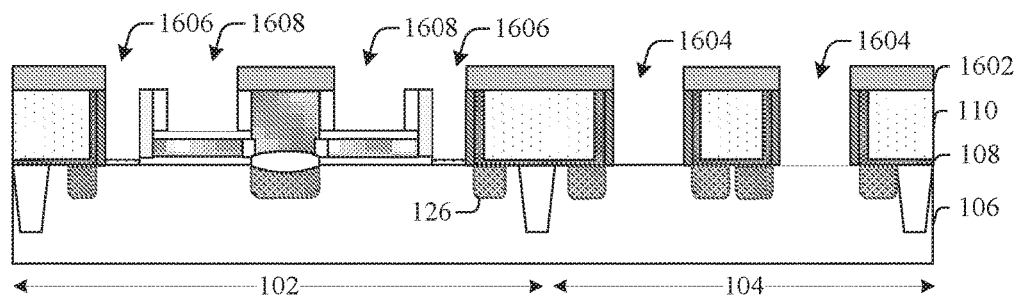
Figure 16B:
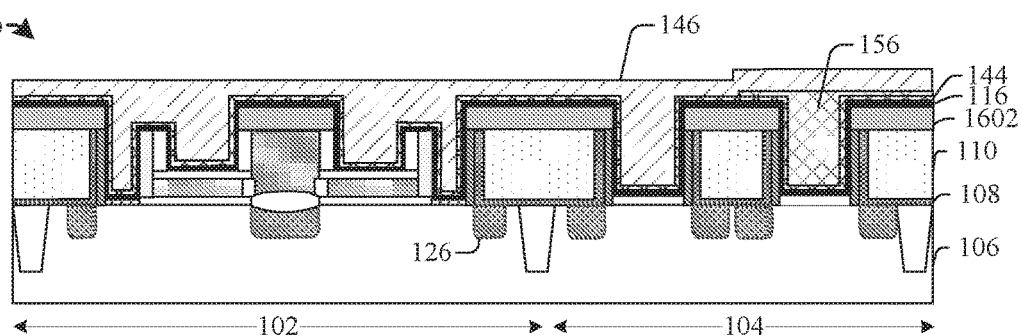
Figure 16C:
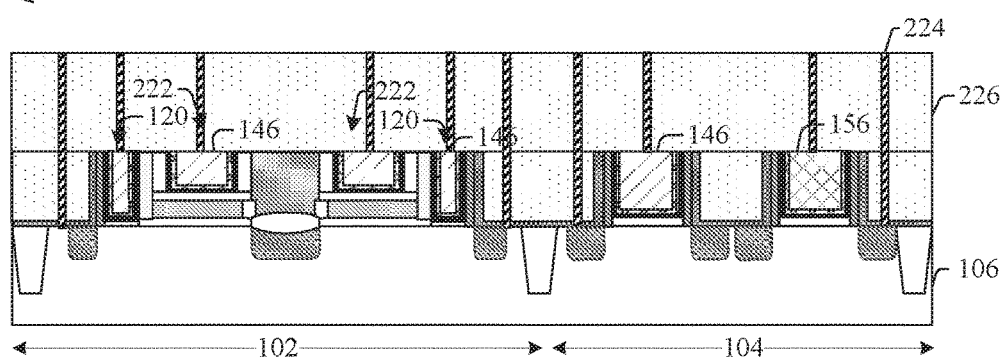

FIGS. 16A-16C show some alternative embodiments of the replacement gate process where the sacrificial logic gate stacks, the select gate electrodes 220 and the control gate electrodes 122 are removed and replaced by metal materials and a high-k dielectric layer. As shown in cross-sectional view 1600a of FIG. 16A, the sacrificial logic gate stack (i.e. the first sacrificial gate material 706 and the second sacrificial gate material 708), the select gate electrodes 220, and the control gate electrodes 122 (shown in FIG. 13) are removed with the remaining of the workpiece covered by a hard mask 1602, resulting in the formation of trenches 1604, 1606 and 1608.

As shown in cross-sectional view 1600b of FIG. 16B, a high-k gate dielectric layer 116 and metal gate materials (e.g. 156, 146) are formed over the first inter-layer dielectric layer 110 and/or the hard mask 1602 and filled into the trenches 1604, 1606, and 1608 of FIG. 16A through one or more deposition processes (e.g., chemical vapor deposition, physical vapor deposition, etc.). In some embodiments, a barrier layer 144 is lined between the high-k gate dielectric layer 116 and the metal gate materials, to protect the metal gate materials (e.g. 156, 146) from diffusion.

As shown in cross-sectional view 1600c of FIG. 16C, a second planarization process may be performed following the deposition processes to form a first metal gate electrode 114, a second metal gate electrode 158, metal select gate electrodes 120, and metal control gate electrodes 222 on the high-k gate dielectric layer 116.

Figure 17:
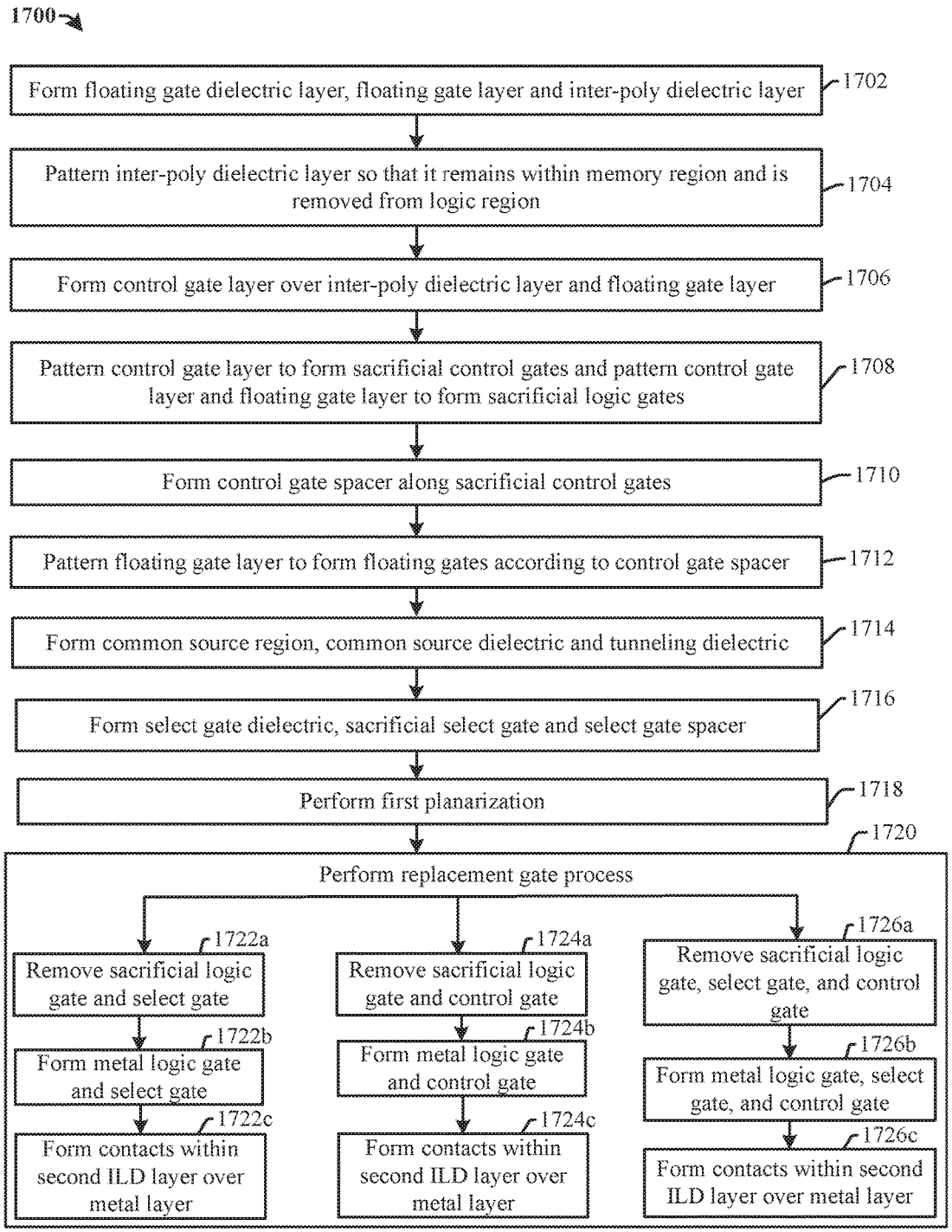
FIG. 17 illustrates a flow diagram of some embodiments of a method for manufacturing an IC comprising a hybrid or HKMG NVM device.

FIG. 17 illustrates a flow diagram of some embodiments of a method 1700 for manufacturing an IC comprising a hybrid NVM device.

Although method 1700 is described in relation to FIGS. 4-13 and 14A-14C through 16A-16C, it will be appreciated that the method 1700 is not limited to such structures, but instead may stand alone as a method independent of the structures. Furthermore, while the disclosed methods (e.g., method 1700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a floating gate dielectric layer, a floating gate layer and an inter-poly dielectric layer are formed over a substrate within a memory region and a logic region. FIG. 4 illustrates some embodiments of a cross-sectional view 400 corresponding to act 1702.

At 1704, the inter-poly dielectric layer is patterned so that it remains within the memory region and so that it is removed from the logic region. In some embodiments, the inter-poly dielectric layer is etched to stop on an insolation structure at a peripheral region of the memory region. FIG. 5 illustrates some embodiments of a cross-sectional view 500 corresponding to act 1704.

At 1706, a control gate layer and a hard mask layer are subsequently formed on the remaining inter-poly dielectric layer within the memory region and on the floating gate layer within the logic region. FIG. 6 illustrates some embodiments of a cross-sectional view 600 corresponding to act 1706.

At 1708, the hard mask layer, the control gate layer and the floating gate layer within the logic region are patterned to form a sacrificial logic gate stack. The hard mask layer and the control gate layer within the memory region are patterned to form a control gate stack.

At 1710, a control gate spacer is formed along the sacrificial logic gate stack and the control gate stack. FIG. 7 illustrates some embodiments of a cross-sectional view 700 corresponding to act 1708 and act 1710.

At 1712, the inter-poly dielectric layer and the floating gate layer within the memory region are patterned to form a memory gate stack together with the control gate stack. FIG. 8 illustrates some embodiments of a cross-sectional view 800 corresponding to act 1712.

At 1714, a common source/drain region is formed between opposing sides of the memory gate stacks within the substrate. A common source/drain dielectric and a tunneling dielectric layer are formed on the common source/drain region along the opposing sides of the floating gates.

FIG. 9 illustrates some embodiments of a cross-sectional view 900 corresponding to act 1714.

At 1716, a select gate dielectric, select gates and a select gate spacer are subsequently formed at opposite sides of the memory gate stacks. FIGS. 10-12 illustrate some embodiments of cross-sectional views 1000, 1100 and 1200 corresponding to act 1716.

At 1718, a contact etch stop layer is formed over the substrate, a first inter-level dielectric layer is formed over the contact etch stop layer, and a first planarization is performed. The sacrificial logic gate stacks within the logic region are exposed. FIG. 13 illustrates some embodiments of a cross-sectional view 1300 corresponding to act 1718.

At 1720, a replacement gate process is subsequently performed. In various embodiments, the replacement gate process may be formed according to acts 1722a-1722c, acts 1724a-1724c, or acts 1726a-1726c.

At 1722a-1722c, a logic gate electrode within the logic region and a select gate electrode within the memory region are replaced by metal gate electrodes. FIGS. 14A-14C illustrate some embodiments of cross-sectional views 1400a-1400c corresponding to act 1722a-1722c.

At 1724a-1724c, a logic gate electrode within the logic region and a control gate electrode within the memory region are replaced by metal gate electrodes. FIGS. 15A-15C illustrate some embodiments of cross-sectional views 1500a-1500c corresponding to act 1724a-1724c.

At 1726a-1726c, a logic gate within the logic region and a select gate electrode and a control gate electrode within the memory region are replaced by metal gate electrodes. FIGS. 16A-16C illustrate some embodiments of cross-sectional views 1600a-1600c corresponding to act 1726a-1726c.

Therefore, the present disclosure relates to an integrated circuit (IC) that comprises a high-k metal gate (HKMG) non-volatile memory (NVM) device and that provides small scale and high performance, and a method of formation.

In some embodiments, the present disclosure relates to an integrated circuit. The integrated circuit comprises a memory region comprising a non-volatile memory (NVM) device having a pair of control gate electrodes separated from a substrate by corresponding floating gates. A pair of select gate electrodes are disposed at opposite sides of the pair of control gate electrodes. The integrated circuit further comprises a logic region disposed adjacent to the memory region and comprising a logic device including a first metal gate electrode disposed over a logic gate dielectric and having bottom and sidewall surfaces covered by a high-k gate dielectric layer. The select gate electrodes or the control gate electrodes comprise metal and have bottom and sidewall surfaces covered by the high-k gate dielectric layer.

In other embodiments, the present disclosure relates to an integrated circuit. The integrated circuit comprises a memory region comprising a non-volatile memory (NVM) device having a pair of control gate electrodes disposed over a corresponding pair of floating gates that separate from a substrate by a floating gate dielectric. A pair of select gate electrodes are disposed at opposite sides of the pairs of control gate electrodes and the floating gates. The select gate electrodes are separated from the substrate by a select gate dielectric having a thickness smaller than a thickness of the floating gate dielectric. The integrated circuit further comprises disposed adjacent to the memory region and comprising a logic device including a NMOS transistor and a PMOS transistor, the NMOS transistor comprising a first metal gate electrode and the PMOS transistor comprising a second metal gate electrode. The first and second metal gate electrodes are respectively disposed over a logic gate dielectric and have bottom and sidewall surfaces covered by a high-k gate dielectric layer. The select gate electrodes or the control gate electrodes comprise the same material as the first metal gate electrode and have bottom and sidewall surfaces covered by the high-k gate dielectric layer.

In yet other embodiments, the present disclosure relates to a method of forming an integrated circuit. The method comprises providing a substrate comprising a memory region and a logic region and forming and patterning a control gate layer over a floating gate layer to form a pair of sacrificial control gates over the memory region. The method further comprises forming and patterning the control gate layer and the floating gate layer to form a pair of sacrificial logic gates over the logic region and forming a pair of sacrificial select gates at outer sides of the pair of sacrificial control gates. The method further comprises replacing the pair of sacrificial select gates or the pair of sacrificial control gates, together with one of the pair of sacrificial logic gates, by a high-k dielectric layer and a first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a memory region comprising a non-volatile memory (NVM) device having a pair of control gate electrodes separated from a substrate by corresponding floating gates, wherein a pair of select gate electrodes are disposed at opposite sides of the pair of control gate electrodes; and
a logic region disposed adjacent to the memory region and comprising a logic device including a first metal gate electrode disposed over a logic gate dielectric and having bottom and sidewall surfaces covered by a high-k gate dielectric layer;
wherein the select gate electrodes or the control gate electrodes comprise metal, and the metal select gate electrodes or the metal control gate electrodes have bottom and sidewall surfaces covered by the high-k gate dielectric layer;
wherein the control gate electrodes and the select gate electrodes have upper surfaces coplanar with an upper surface of the first metal gate electrode.

2. The IC of claim 1, wherein the select gate electrodes are made of the same metal as the first metal gate electrode and are separated from the substrate by the high-k gate dielectric layer and a select gate dielectric.

3. The IC of claim 2, wherein the control gate electrodes are made of the same metal as the first metal gate electrode and are separated from the substrate by the high-k gate dielectric layer and a floating gate dielectric.

4. The IC of claim 1, wherein the floating gates are disposed on a floating gate dielectric and have upper surfaces covered by an inter-poly dielectric, wherein the floating gate dielectric and the inter-poly dielectric have thicknesses that are each greater than a thickness of a select gate dielectric under the select gate electrodes.

5. The IC of claim 4, further comprising:
a control gate spacer disposed on the inter-poly dielectric and along sidewalls of the pair of control gate electrodes;
a floating gate spacer disposed on the floating gate dielectric and along outer sidewalls of the floating gates, the inter-poly dielectric, and the control gate spacer; and
a select gate spacer disposed on an upper surface of the substrate and along outer sidewalls of the pair of the select gate electrodes.

6. An integrated circuit (IC), comprising:
a memory region comprising a non-volatile memory (NVM) device having a pair of control gate electrodes disposed over a corresponding pair of floating gates that are separated from a substrate by a floating gate dielectric, the NVM device further comprising a pair of select gate electrodes disposed at opposite sides of the pairs of control gate electrodes, wherein the select gate electrodes are separated from the substrate by a select gate dielectric having a thickness smaller than a thickness of the floating gate dielectric; and
a logic region disposed adjacent to the memory region and comprising a logic device including a NMOS transistor and a PMOS transistor, the NMOS transistor comprising a first metal gate electrode and the PMOS transistor comprising a second metal gate electrode;
wherein the first and second metal gate electrodes are respectively disposed over a logic gate dielectric and have bottom and sidewall surfaces covered by a high-k gate dielectric layer;
wherein the select gate electrodes or the control gate electrodes comprise the same material as the first metal gate electrode and have bottom and sidewall surfaces covered by the high-k gate dielectric layer.

7. The IC of claim 6, wherein the control gate electrodes and the select gate electrodes have cuboid shapes, which have upper surfaces coplanar with an upper surface of the first metal gate electrode.

8. The IC of claim 6, further comprising:
an inter-poly dielectric disposed between the floating gates and the control gate electrodes,
a control gate spacer disposed on the inter-poly dielectric and along sidewalls of the control gate electrodes;
a floating gate spacer disposed on the floating gate dielectric and along outer sidewalls of the floating gates, the inter-poly dielectric and the control gate spacer; and
a tunneling dielectric layer disposed along inner sidewalls of the floating gates.

9. The IC of claim 8, further comprising:
an erase gate electrode disposed abutting inner sidewalls of the tunneling dielectric layer and the control gate spacer.

10. An integrated circuit (IC), comprising:
a substrate comprising a memory region and a logic region adjacent to the memory region;
a pair of floating gates disposed over a memory gate dielectric within the memory region;
a pair of control gate electrodes disposed over the floating gates;
a pair of select gate electrodes disposed at outer sides of the pair of control gate electrodes; and a pair of logic gate electrodes disposed over a logic gate dielectric within the logic region;
where in the control gate electrodes, the select gate electrodes, and the logic gate electrodes respectively comprise a metal electrode having bottom and sidewall surfaces covered by a high-k gate dielectric layer.

11. The IC of claim 10, further comprising:
a control gate spacer disposed along sidewalls of the pair of control gate electrodes; and
an inter-poly dielectric layer between the floating gates and the control gate electrodes;
wherein a sidewall of the inter-poly dielectric layer is coplanar with a sidewall of the floating gates and an outer sidewall of the control gate spacer.

12. The IC of claim 11, further comprising:
a floating gate spacer disposed along sidewalls of the control gate spacer and the pair of floating gates;
wherein the floating gate spacer sits on a top surface of the memory gate dielectric.

13. The IC of claim 10, further comprising:
a select gate spacer disposed along sidewalls of the pair of select gate electrodes, the pair of logic gate electrodes, and the memory gate dielectric;
wherein the select gate spacer is in direct contact with a top surface of the substrate.

14. The IC of claim 13, wherein a sidewall of the select gate spacer is in direct contact with sidewalls of the high-k gate dielectric layer.

15. The IC of claim 10, wherein the control gate electrodes and the select gate electrodes have cuboid shapes, which have upper surfaces coplanar with an upper surface of the logic gate electrodes.

16. The IC of claim 10, wherein the control gate electrodes are separated from the substrate by the high-k gate dielectric layer and a floating gate dielectric.

17. The IC of claim 1, wherein the control gate electrodes and the select gate electrodes have cuboid shapes.

18. An integrated circuit (IC), comprising:
a memory region comprising a non-volatile memory (NVM) device having a pair of control gate electrodes separated from a substrate by corresponding floating gates, wherein a pair of select gate electrodes are disposed at opposite sides of the pair of control gate electrodes; and
a logic region disposed adjacent to the memory region and comprising a logic device including a first metal gate electrode disposed over a logic gate dielectric and having bottom and sidewall surfaces covered by a high-k gate dielectric layer;
wherein the select gate electrodes or the control gate electrodes comprise metal, and have bottom and sidewall surfaces covered by the high-k gate dielectric layer;
wherein the control gate electrodes are made of the same material as the first metal gate electrode and are separated from the substrate by the high-k gate dielectric layer and a floating gate dielectric.

19. The IC of claim 18, wherein the first metal gate electrode is a gate electrode for an NMOS transistor.

20. The IC of claim 18, wherein the control gate electrodes and the select gate electrodes have upper surfaces coplanar with an upper surface of the first metal gate electrode.

* * * * *